US011169198B2

United States Patent
Hackl

(10) Patent No.: US 11,169,198 B2
(45) Date of Patent: Nov. 9, 2021

(54) MAGNETIC FIELD MEASURING DEVICE AND METHOD FOR DETECTING A LOCALIZATION CURRENT IN A BRANCHED AC POWER SUPPLY SYSTEM

(71) Applicant: Bender GmbH & Co. KG, Gruenberg (DE)

(72) Inventor: Dieter Hackl, Fernwald (DE)

(73) Assignee: BENDER GMBH & CO. KG, Gruenberg (DE)

( * ) Notice: Subject to any disclaimer, the term of this patent is extended or adjusted under 35 U.S.C. 154(b) by 43 days.

(21) Appl. No.: 16/699,787

(22) Filed: Dec. 2, 2019

(65) Prior Publication Data
US 2020/0174059 A1    Jun. 4, 2020

(30) Foreign Application Priority Data

Dec. 3, 2018    (DE) .................... 10 2018 130 690.3

(51) Int. Cl.
| | |
|---|---|
| *G01R 31/12* | (2020.01) |
| *G01R 19/00* | (2006.01) |
| *G01R 31/08* | (2020.01) |
| *G01R 33/00* | (2006.01) |

(52) U.S. Cl.
CPC ..... *G01R 31/1272* (2013.01); *G01R 19/0092* (2013.01); *G01R 31/08* (2013.01); *G01R 33/0017* (2013.01)

(58) Field of Classification Search
CPC ............ G01R 31/1272; G01R 19/0092; G01R 31/08; G01R 33/0017; G01R 31/083; G01R 15/185; G01R 31/52; G01R 15/20; G01R 29/0878; G01R 31/12; G01R 31/42; G01R 1/28

See application file for complete search history.

(56) References Cited

U.S. PATENT DOCUMENTS

| | | | |
|---|---|---|---|
| 4,278,940 A | 7/1981 | Milkovic | |
| 5,075,628 A | 12/1991 | Schuster et al. | |
| 2014/0021939 A1* | 1/2014 | Dobrenko | G01R 15/185 324/127 |
| 2015/0016006 A1* | 1/2015 | van Vroonhoven | H01F 13/006 361/149 |

(Continued)

FOREIGN PATENT DOCUMENTS

| | | |
|---|---|---|
| DE | 102015214615 A1 | 2/2017 |
| EP | 2905627 A1 | 8/2015 |

*Primary Examiner* — Akm Zakaria
(74) *Attorney, Agent, or Firm* — Dickinson Wright PLLC; Andrew D. Dorisio

(57) ABSTRACT

The invention relates to a magnetic field measuring device and a method for detecting a localization current in a branched AC power supply system. Furthermore, the invention relates to a use of the magnetic field measuring device according to the invention as a device for detecting a test current for an insulation fault localization system. By combining two current sensors having a different magnetic field measuring sensitivity and a different magnetic field measuring range, it can be achieved that a reliable detection of localization currents in insulation fault localization systems is possible by means of a constructionally easy and cost-effective realization, in particular as retrofitting in existing systems.

15 Claims, 9 Drawing Sheets

(56) References Cited

U.S. PATENT DOCUMENTS

Figure 1:
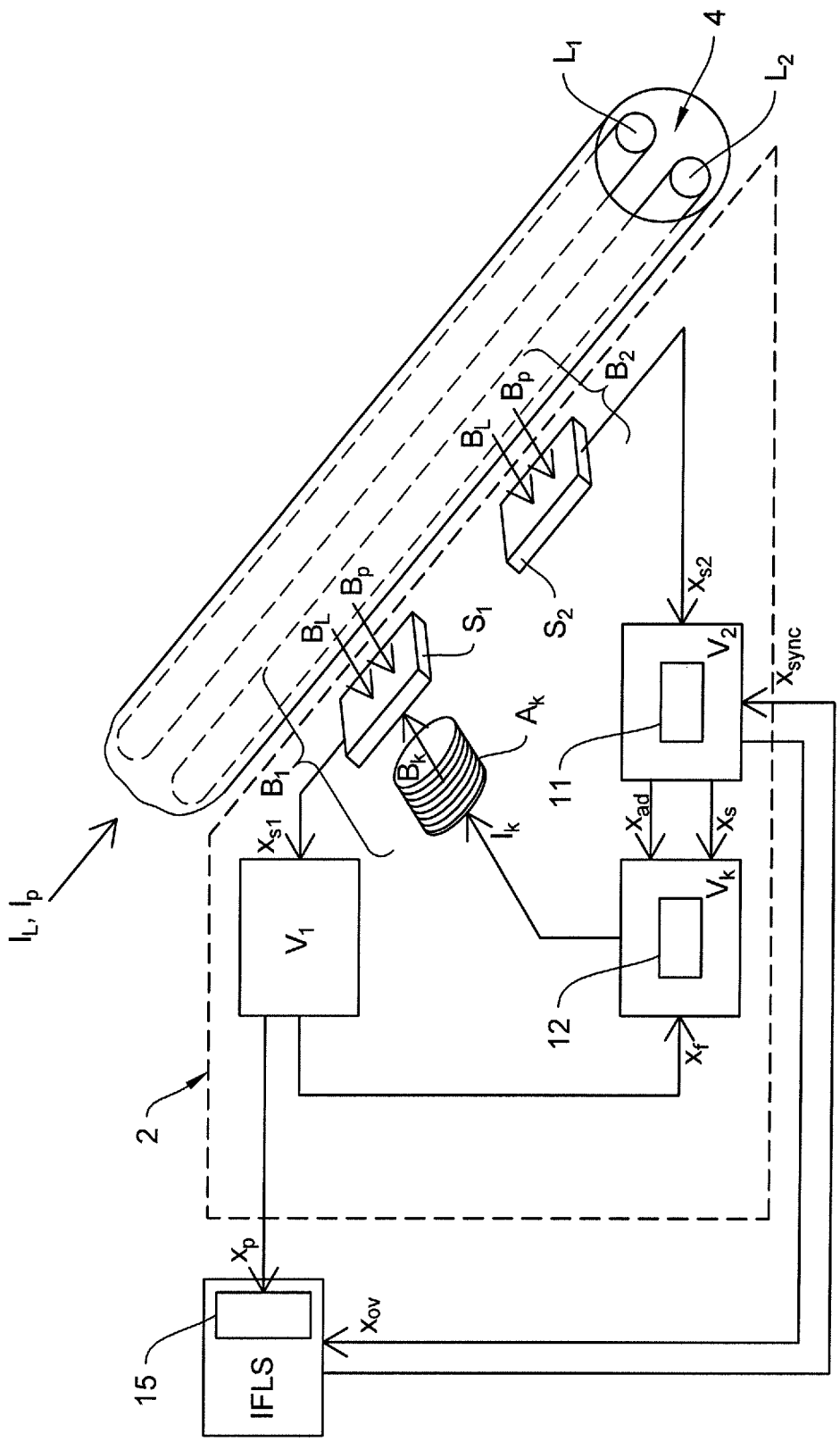

| | | | |
|---|---|---|---|
| 2015/0042325 A1* | 2/2015 | Snoeij | G01R 19/0092 |
| | | | 324/251 |
| 2015/0108967 A1* | 4/2015 | Barczyk | G01R 15/183 |
| | | | 324/202 |
| 2019/0154467 A1* | 5/2019 | Buck | H05K 1/185 |
| 2019/0317135 A1* | 10/2019 | Guillot | G01R 23/20 |

* cited by examiner

MAGNETIC FIELD MEASURING DEVICE AND METHOD FOR DETECTING A LOCALIZATION CURRENT IN A BRANCHED AC POWER SUPPLY SYSTEM

This application claims the benefit of German Patent Application No. DE 10 2018 130 690.3, filed Dec. 3, 2018, the disclosure of which is incorporated herein by reference.

TECHNICAL FIELD

The invention relates to a magnetic field measuring device and a method for detecting a localization current in a branched AC power supply system, wherein a load current having a mains frequency flows through a line section to be tested of the AC power supply system and the localization current has a frequency lower than the mains frequency.

Furthermore, the invention relates to a use of the magnetic field measuring device according to the invention as a device for detecting a localization current for an insulation fault localization system.

BACKGROUND

To begin with, the significance of an insulation fault localization system and the resulting necessity of detecting a localization current are shown in the following with an ungrounded power supply system as an example. The invention is, however, not limited to ungrounded power supply systems and can generally be used in a high resistance or low resistanceg-rounded power supply system for any application where a detection of a localization current is necessary.

For increased requirements regarding operation, fire and contact safety, the network structure of an ungrounded power supply system is used, which is also referred to as an isolated network (French: Isolé Terre—IT) or as an IT power supply system.

With this type of power supply system, the active parts of the network are disconnected from the ground potential—isolated against ground—or are connected to ground via a high-resistance impedance.

The advantage of such networks is that when an insulation fault (first fault) such as a ground fault or a body fault occurs, the function of the connected electric loads is not compromised, because due to the ideally infinitely large impedance value, no closed fault current circuit can be formed between an active conductor of the network and ground.

Therefore, a continuous power supply to the load fed by the ungrounded power supply system can even be guaranteed by means of this inherent safety of the ungrounded power supply system, when a first insulation fault occurs.

The resistance of the ungrounded power supply system against ground (insulation resistance—in case of fault also insulation fault resistance or fault resistance) must therefore be monitored at all times, because in case of a possible additional fault on another active conductor (second fault), a fault loop would occur and, in connection with an overcurrent protective device, the resulting fault current would cause a shutdown of the system and an operational standstill.

Provided that the state of insulation of the ungrounded power supply system is monitored at all times by an insulation monitoring device (IMD), the ungrounded power supply system can continuously be operated without a stipulated time limitation even when a first fault occurs, but it is recommended that the first fault is eliminated as quickly as practicable.

In order to fulfil the requirement for the quick elemination of the first fault, the use of an insulation fault localization system/insulation fault locating device (IFLS) as described in product standard IEC 61557-9 represents the state of the art, in particular in expanded, widely branched ungrounded power supply systems.

The insulation fault localization system essentially comprises a testing current generator and several testing current sensors, mostly realized as measuring current transformers, which are connected to an evaluation unit of the insulation fault localization system for evaluating the measuring signals.

If a first insulation fault is detected by the insulation monitoring device in the ungrounded power supply system, insulation fault tracking starts by means of the test current generator generating a test current and feeding it as a localization current into the ungrounded power supply system at a central location between one or several active conductors and ground. A closed test current circuit is formed in which the localization current flows from the test current generator to the voltage-carrying active conductors, the insulation fault and via a ground connection back to the test current generator.

The localization of the fault location is effected by a detection of the localization current in the ungrounded power supply system by means of the test current sensors, wherein a test current sensor is fixedly assigned to each line section to be monitored and therefore the path of the test current (localization current) is trackable.

The localization current is detected by all test current sensors which are located within the circuit of the localization current (test current circuit) and evaluated and indicated in the evaluation unit of the insulation fault localization system. The fault location can be localized since it is known which test current sensor is assigned to which line section.

In particular with already existing electrical systems, there is an increased demand for expansion or retrofitting capability of such insulation fault localization systems. The decisive factor for the approval of such an insulation fault tracking device in existing systems is the possibility of a favorable upgrade with regard to cost and effort. In order to meet these basic requirements, a test current sensor technology for detecting the localization current having the following characteristics is needed:

- small and compact in size and suitable for retrofitting in existing systems with narrow, hard-to-access electric cable routing without having to reconstruct the cabling,
- very low power input in order to allow retrofitting in locations without a mains connection (socket),
- very high magnetic field measuring sensitivity (in the range of several mA) for detecting the test current fed in for fault localization, wherein the frequency of the localization current is usually within the range significantly lower than 10 Hz, due to the usual size of system leakage capacitances;
- uninterrupted fault localization for mains-frequency load currents up to the range of several 100 A,
- no destruction effects or notable saturation effects for short circuit currents in the range of kA,
- the costs for the sensors together with the costs for the rest of the fault localization system must offer a significant economical advantage compared to conventional fault localization methods.

Up to now, there is no current measurement concept according to the state of the art that comprises all aforementioned characteristics. Known measurement methods for detecting the localization current have the following disadvantages:

- A non-isolated measurement with shunt resistors is not accepted as a retrofit solution for most cases of application, because the electrical system would have to be rebuilt completely for this purpose. In addition, the resulting high power dissipation for high load currents is another undesirable characteristic.
- Current transformers according to the Rogowski principle can be retrofitted easily but they are unable to provide the required high magnetic field measuring sensitivity in the mA range for frequencies lower than 10 Hz.
- Current transformers having a highly permeable soft magnetic core and a construction form having a small air gap can be designed such that a high magnetic field measuring sensitivity in the mA range is reached for frequencies lower than 10 Hz. Error-free fault localization for mains-frequency load currents up to a range of several 100 A can only be realized, if current sensors in the form of residual current transformers are used. In this case, however, certain conditions which require significantly more assembly space in the control cabinet must be met for cable installation, which is why they are rarely found in their ideal state in practice. Especially for larger load currents, residual current transformers having a larger core volume are required. This significantly complicates retrofitting in existing systems and leads to reasonable economical limits being exceeded for some applications. For larger short circuit currents in the range of kA, saturation effects are to be expected and, without additional measures, also destruction.
- Zero flux transformers according to the compensation principle having a fluxgate induction sensor meet the metrological requirements ideally. In order to maintain the function with high load currents and to minimize the negative impacts of large short circuit currents, however, a substantially greater effort than for current transformers or residual current transformers is necessary. In addition to significantly higher costs, the compensation principle in connection with a large, highly permeable core also requires significantly more supply power for the sensor. For many applications, retrofitting is therefore even more difficult than for current transformers or residual current transformers.
- Current transformers according to the compensation principle using other magnetic field sensors such as Hall effect sensors or GMR (giant magneto resistive) sensors rarely meet the metrological requirements for the extremely high dynamic range. For the high dynamic range required, the costs of this solution are too high for it to be used for the considered applications.

If due to the aforementioned reasons, the effort for retrofitting a fault localization system does not have an economical advantage over manual fault detection by a qualified electrician, then fault localization systems have not been used so far and manual fault detection was used. The main disadvantage in this connection is that a first insulation fault occurring in the electrical system is lasting for much longer with manual fault detection, because fault localization takes longer than insulation fault tracking provided by a fault localization system.

Furthermore, additional risks for the qualified electrician often arise from manual fault tracking. For manual fault tracking without an installed insulation fault localization system in photovoltaic systems, for example, work would have to be conducted on live installations in the worst case.

SUMMARY

The object of the present invention is therefore to create a test current sensor technology for detecting a localization current for an insulation fault localization system in an AC power supply system, which can cost-effectively and easily be retrofitted.

The object is attained by a magnetic field measuring device comprising a current sensor arrangement mounted on the line section to be tested which is comprised of a first current sensor, a second current sensor and a compensating coil. The compensating coil generates a compensating magnetic field which is formed in a detection range of the first current sensor and which causes a partial compensation of a mains-frequency alternating magnetic field which is caused by the load current only in said detection range of the first current sensor.

The magnetic field measuring device also comprises a first signal processing block, a second signal processing block and a compensation block.

The first current sensor and the second current sensor are disposed such that, in addition to the compensating magnetic field generated by the compensation coil, the first current sensor also detects the alternating magnetic field of the load current and a common-mode magnetic field caused by the localization current. This magnetic field which is formed in the detection range of the first current sensor is in this case referred to as partly compensated magnetic field. The current sensor arrangement, in particular the spacing of the first current sensor to the second current sensor is realized such that the impact of the compensating magnetic field generated by the compensating coil on the second current sensor is negligible, the second current sensor thus detecting only the alternating magnetic field and the common-mode magnetic field caused by the localization current as a resulting magnetic field.

Therefore, the compensating magnetic field generated by the compensating coil causes a partial compensation of the mains-frequency alternating magnetic field in the detection range of the first current sensor but it does not interfere with the detection of the alternating magnetic field and the common-mode magnetic field in the detection range of the second current sensor.

The first signal processing block generates a localization signal indicating the localization current from a first sensor output signal generated by the first current sensor. This localization signal therefore reflects the existence of the localization current in the line section to be tested and can, in connection with an insulation fault localization system, be transmitted as a detection signal to an evaluation unit of the insulation fault localization system.

The second signal processing block, which receives a second sensor signal, which is derived from the detected resulting magnetic field, from the second current sensor, generates a corresponding alternating voltage signal therefrom.

The compensating block connected downstream of the second signal processing block generates a compensating current from the alternating voltage signal, which feeds the compensating coil for generating the compensating magnetic field.

Furthermore, the second signal processing block has a signal input for receiving a synchronization signal in order to synchronize a measuring period, which is predefined by the superordinate insulation fault localization system and during which the localization current is detected, with the alternating voltage signal. This synchronization measure ensures that during the measuring period, in which a detection of the localization current takes place in an evaluation unit of the insulation fault localization system, the alternating voltage signal supplied by the second signal processing block remains unchanged, equivalent to an effective value of this alternating voltage signal which is constant during the measuring period.

According to the invention, the current sensors are advantageously designed such that the second current sensor has a significantly lower magnetic field measuring sensitivity than the first current sensor and a significantly greater magnetic field measuring range. A lower magnetic field measuring sensitivity is equivalent to a lower measurement resolution and is reflected in a larger numeric value of the measuring sensitivity. Compensation of the mains-frequency alternating magnetic field caused by the load current therefore takes place in the detection range of the first current sensor only to the extent that the partly compensated magnetic field present there does not exceed the magnetic field measuring range of the first current sensor.

It is therefore sufficient if the compensation is successful to the extent that the partly compensated magnetic field remaining in the detection range of the first current sensor is located in the measuring range of the more sensitive first current sensor.

Compared to the first current sensor, the second current sensor is less sensitive, but it is able to process larger alternating magnetic fields.

The mains-frequency alternating magnetic field is not fully compensated; instead it is sufficient that the remaining partly compensated magnetic field does not overload the magnetic field measuring range of the more sensitive first current sensor.

Regarding the magnetic field measuring sensitivities, the combination of both current sensors must sufficiently detect the magnetic field of the localization current and must cover the magnetic field of the load current regarding the magnetic field measuring range.

This combination of two current sensors having different magnetic field measuring sensitivities and different magnetic field measuring ranges according to the invention concludes that the digital signal processing connected downstream of the less sensitive second sensor can be executed significantly less complex and therefore in a cost-effective manner.

In a further advantageous embodiment, the second signal processing block is designed such that the generated alternating voltage signal is continued unchanged during the measuring period, wherein the measuring period extends over several periods of the localization current.

In order to avoid interferences on the fault localization, meaning to ensure an error-free detection of the localization current within the measuring period, the alternating voltage signal generated by the second signal processing block remains unchanged during the measuring period. As described above, the effective value of the alternating voltage signal remains constant during the period of time (measuring period) extending over several periods of the localization current and no control or adjustment process takes place regarding the alternating voltage signal in order to consider, for example, a changing load current.

The measuring period is preferably selected to be long enough for integer periods of the localization current to be covered. Only afterwards changes in the mains-frequency alternating magnetic field also lead to an adjustment of the alternating voltage signal and therefore also to an adjustment of the compensating current generating the compensating magnetic field.

The second signal processing block advantageously has an overload detection for generating an overload signal in case of an overload of the magnetic field measuring range of the first current sensor.

If the mains-frequency alternating field were to change so strongly that the first current sensor would overload despite compensation during a measuring period, the first sensor output signal supplied by the first current sensor cannot be used for further processing any longer. Continuation the measuring period using the incorrect first sensor output signal would lead to an unreliable detection result for the localization current.

The second signal processing block is therefore extended by an overload detection which determines an overload of the first current sensor and sends and overload signal to the insulation fault localization system to restart the measuring period.

Furthermore, the compensating block has an adjustment circuit for adjusting the compensating current and a signal input for receiving an adjustment signal generated by the second signal processing block.

When the adjustment signal generated by the second signal processing block is received, an adjustment of the compensating current, simultaneously with the start of the new measuring period, takes place in the compensation block in such a manner that the partially compensated magnetic field detected by the first current sensor does not (any longer) exceed the magnetic field measuring range of the first current sensor.

The first signal processing block is preferably designed to generate a fine compensating signal which is supplied to the compensating block for fine compensation of the alternating magnetic field.

The first signal processing block generates a fine compensating signal from the first sensor output signal of the first current sensor, which is phase synchronous to the detected mains-frequency alternating magnetic field and whose amplitude corresponds to the not fully compensated effect of this alternating magnetic field on the first current sensor. This fine compensation can be used for reducing the measurement uncertainty of the entire current sensor arrangement by keeping the operating range of the first current sensor regarding the localization current constant. The fine compensation signal generated by the first signal processing block is kept constant during a measuring period of the localization current.

In a specific embodiment, the compensating coil advantageously is a planar coil of which the winding is realized as a conducting path on a circuit board and which has a planar core made of ferrite.

The compensating coil can easily and cost-effectively be realized by mounting its winding as a conducting path on a circuit board.

Preferably, the planar core concentrically has an air gap in which the first current sensor is disposed.

The alternating magnetic field can be compensated especially effective while simultaneously being designed in a compact manner, if the first current sensor is disposed in a concentric air gap of the planar core.

The magnetic field measuring device is advantageously realized as an independent assembly comprising the circuit board and a housing or a casting compound, wherein electronic components for signal processing are additionally disposed on the circuit board.

An embodiment of the magnetic field measuring device as a compact independent module offers the possibility for an easy retrofitting in a cost-effective manner. In particular for spatially restricted conditions, where there is little installation space, for example in a control cabinet, this solution has advantages compared to the use of measuring current transformers.

The second current sensor is preferably disposed on the circuit board or realized as a separate structural unit.

In an especially compact design, the second current sensor is also disposed on the circuit board. It can, however, also be realized as a separate structural unit. What is crucial is that the constructive arrangement of the sensors in the module is realized such that the impact of the mains-frequency alternating magnetic field and the common-mode magnetic field on the first current sensor and the second current sensor is the same. A magnetic strength acting differently in the respective detection ranges of the current sensors would cause a larger uncompensated mains-frequency alternating magnetic field in the detection range of the first current sensor; this must not lead to an overload of the first current sensor.

The magnetic field measuring device according to the invention is preferably used as a device for detecting a localization current (test current detection, test current sensor technology) for an insulation fault localization system in an AC power supply system, wherein the localization signal is transmitted to an evaluation unit of the insulation fault localization system, the synchronization signal is communicated by the insulation fault localization system and the overload signal is supplied to the insulation fault localization system.

The localization signal, which signals the existence of the localization current to the superordinate insulation fault localization system, and the overload signal as a trigger for a restart of the measuring period are supplied to the insulation fault localization system. In return, the second signal processing block receives the synchronization signal from the insulation fault localization system in order to synchronize the alternating voltage signal with the measuring period.

As a component of and in particular as a substitution for the measuring current transformers used according to the state of the art, the magnetic field measuring device according to the invention represents a solution for detecting the localization current that is easy to integrate into the insulation fault localization system and cost-effective.

The reliable detection of low-frequency, small localization currents in the case of existing large mains-frequency load currents is realized by two current sensors of different sensitivity according to the invention, wherein this magnetic field measuring device is designed for the use in insulation fault localization systems due to its compact construction.

Advantageously, a soft magnetic core of a residual current transformer/measuring current transformer, which would have to surround the live conductors of the line section to be monitored, is not used in this case, as opposed to solutions known from the state of the art. Instead, the embodiment according to the invention fulfills the requirements for easy and cost-effective retrofitting in existing systems. The use of the magnetic field measuring device as a device for test current detection for an insulation fault localization system attempts to detect localization currents with the highest sensitivity possible in order to find insulation faults in an AC power supply system as quickly as possible and to be able to eliminate them in a subsequent step. Determining load currents or residual currents as accurately as possible is therefore not the main purpose of the present invention.

The magnetic field measuring device according to the invention is also based on a method for detecting a localization current in a branched AC power supply system. Therefore, the above-mentioned technical effects and advantages resulting therefrom also apply to the features of the method.

In particular by combining two current sensors having different magnetic field measuring sensitivities and different magnetic field measuring ranges, it can be achieved that a reliable detection of localization currents in insulation fault localization systems is possible by means of a constructionally easy and cost-effective realization, in particular by retrofitting existing systems.

BRIEF DESCRIPTION OF THE DRAWING FIGURES

Further advantageous features can be derived from the following descriptions and the drawings, which explain a preferred embodiment of the invention with examples.

Figure 2:
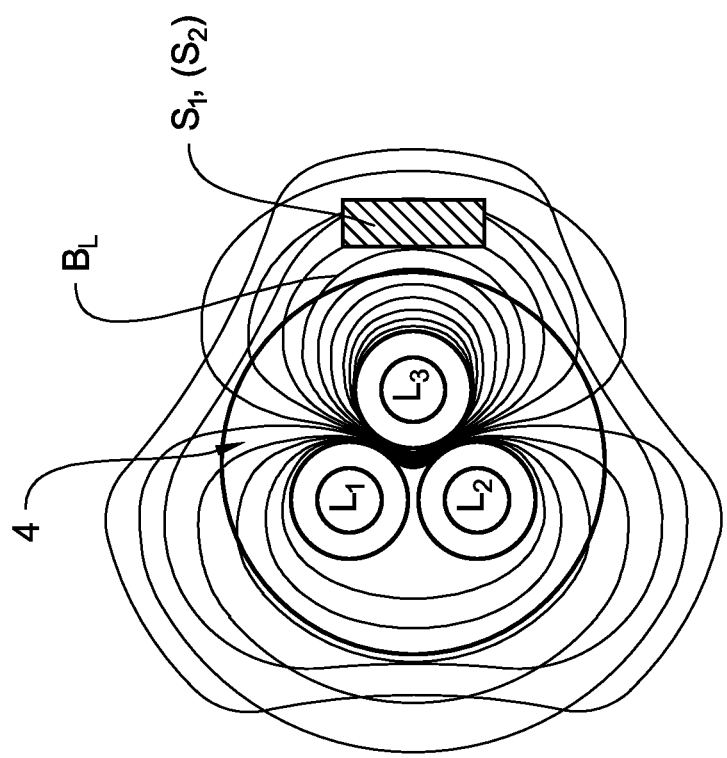
Figure 3:
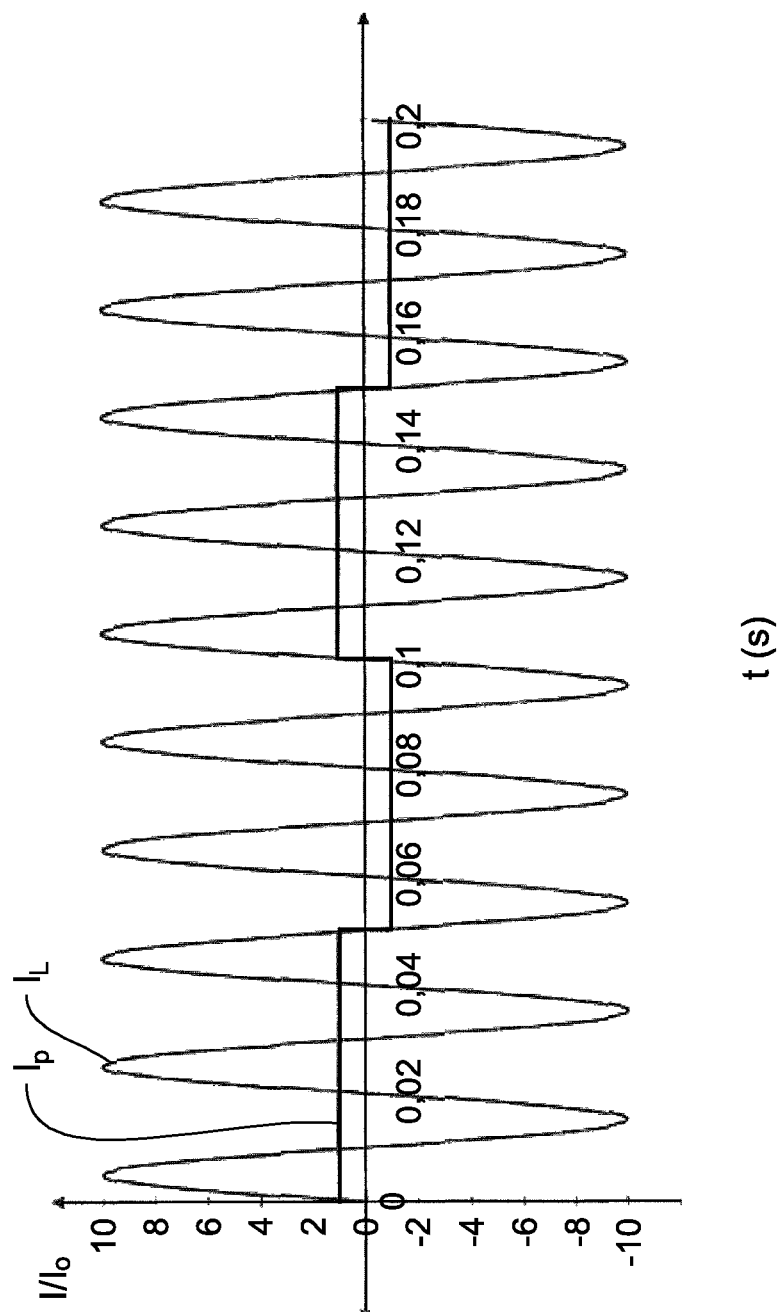
Figure 4:
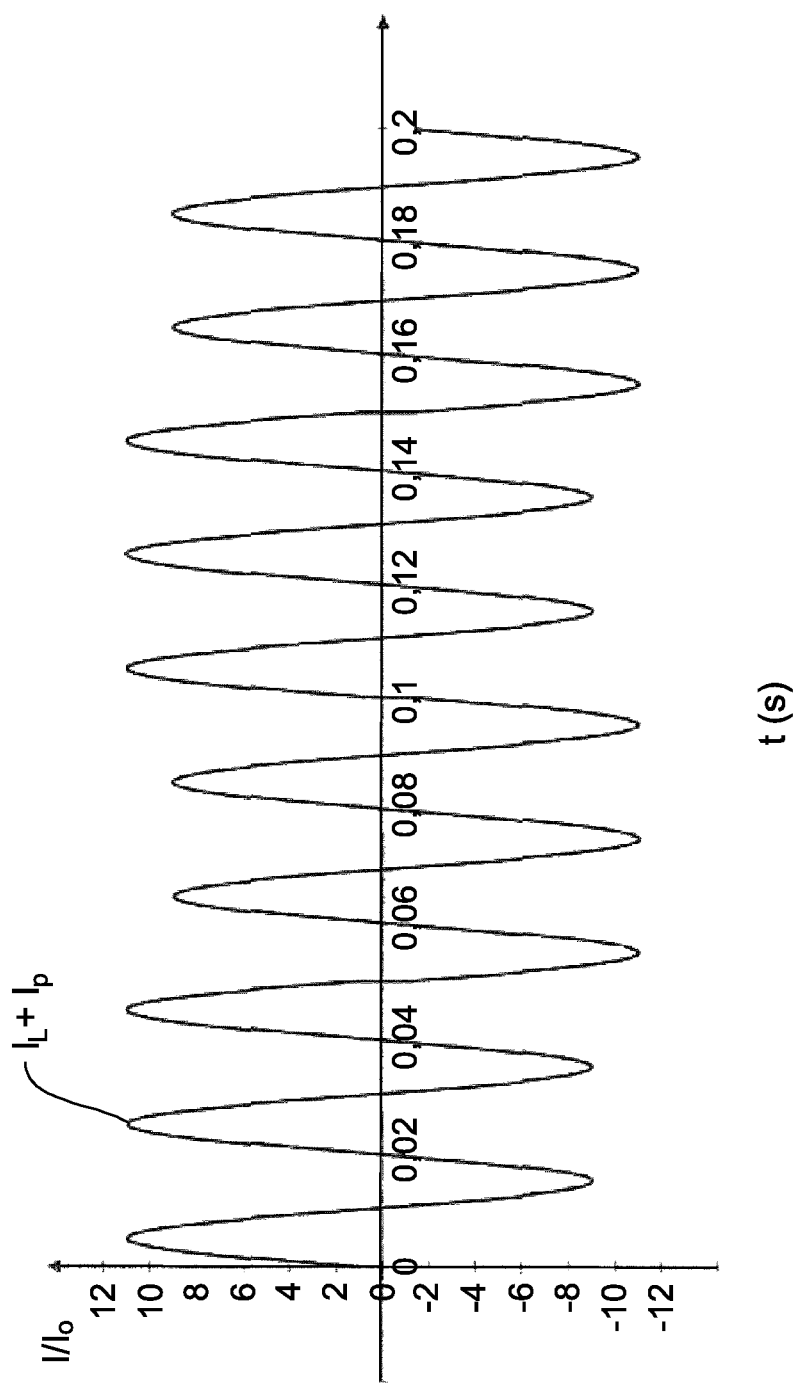
Figure 5:
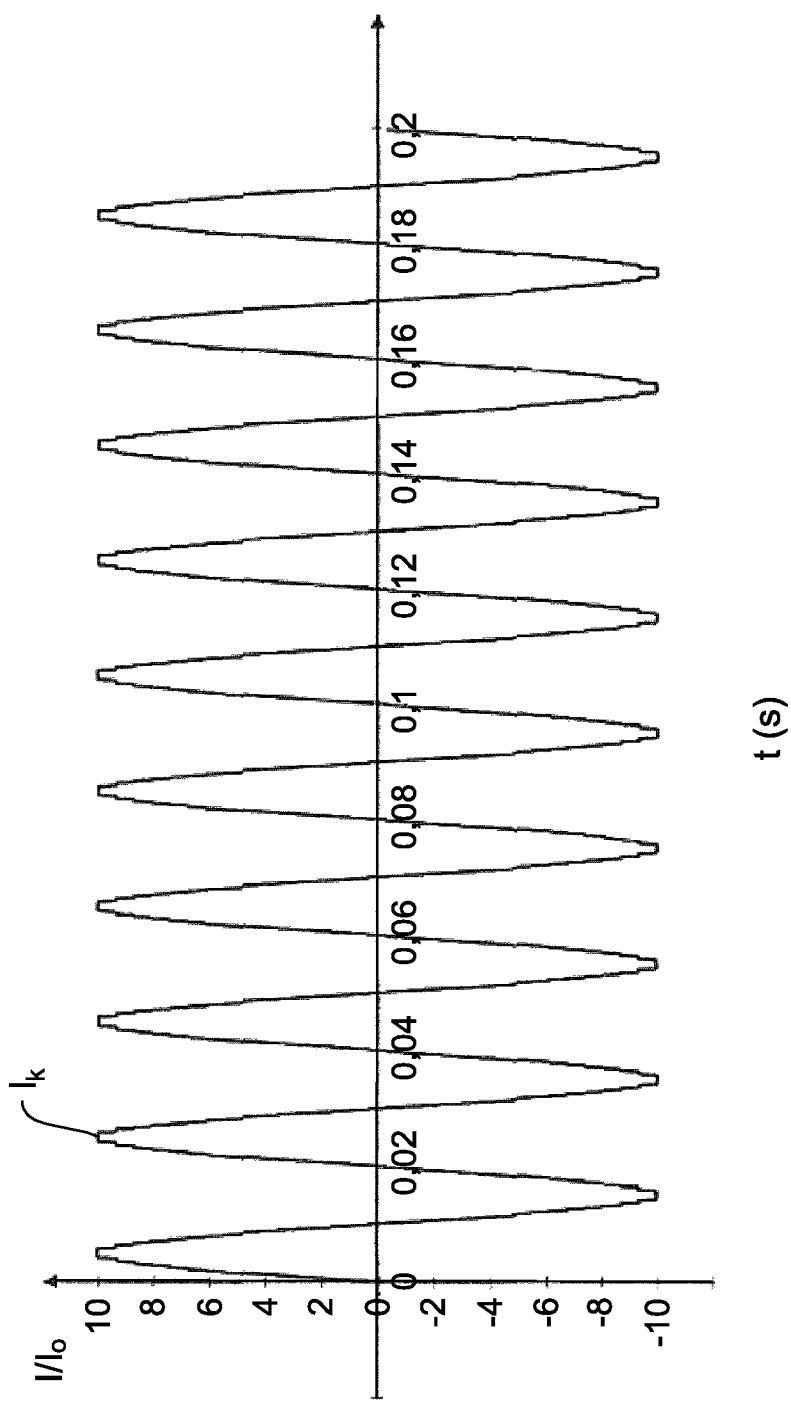
Figure 6:
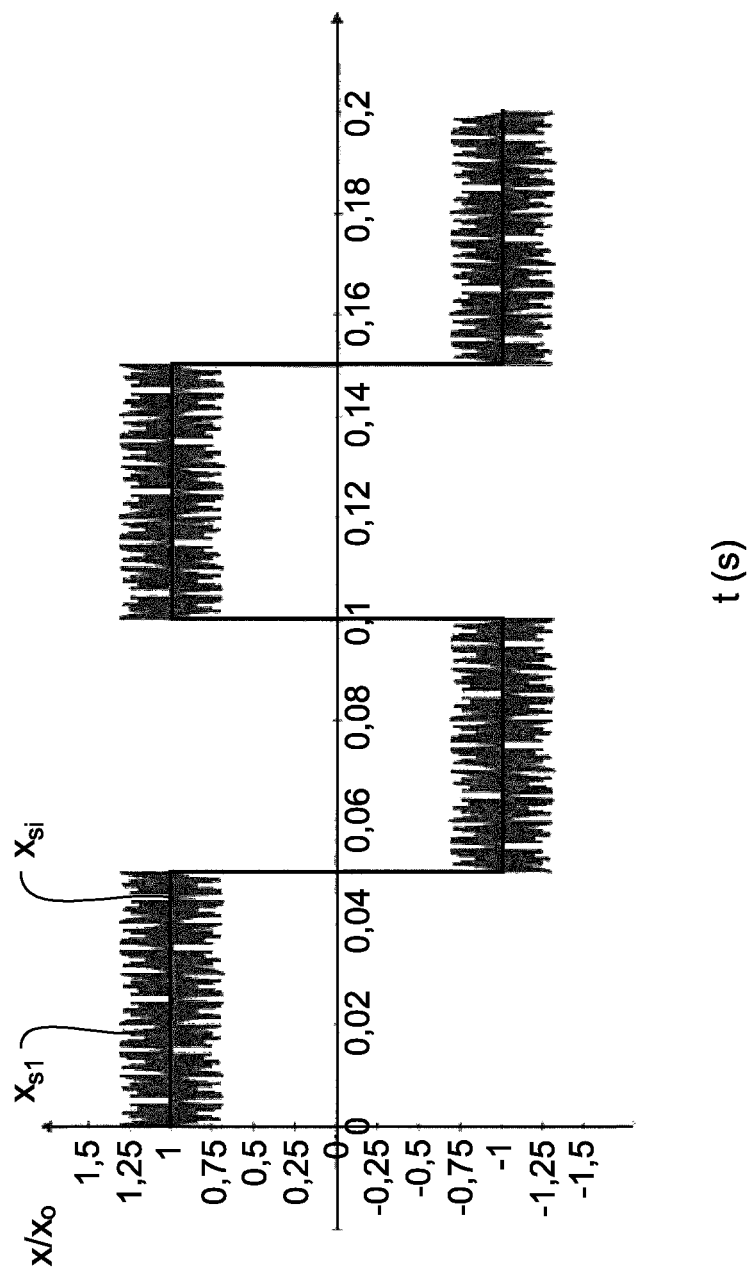
Figure 7:
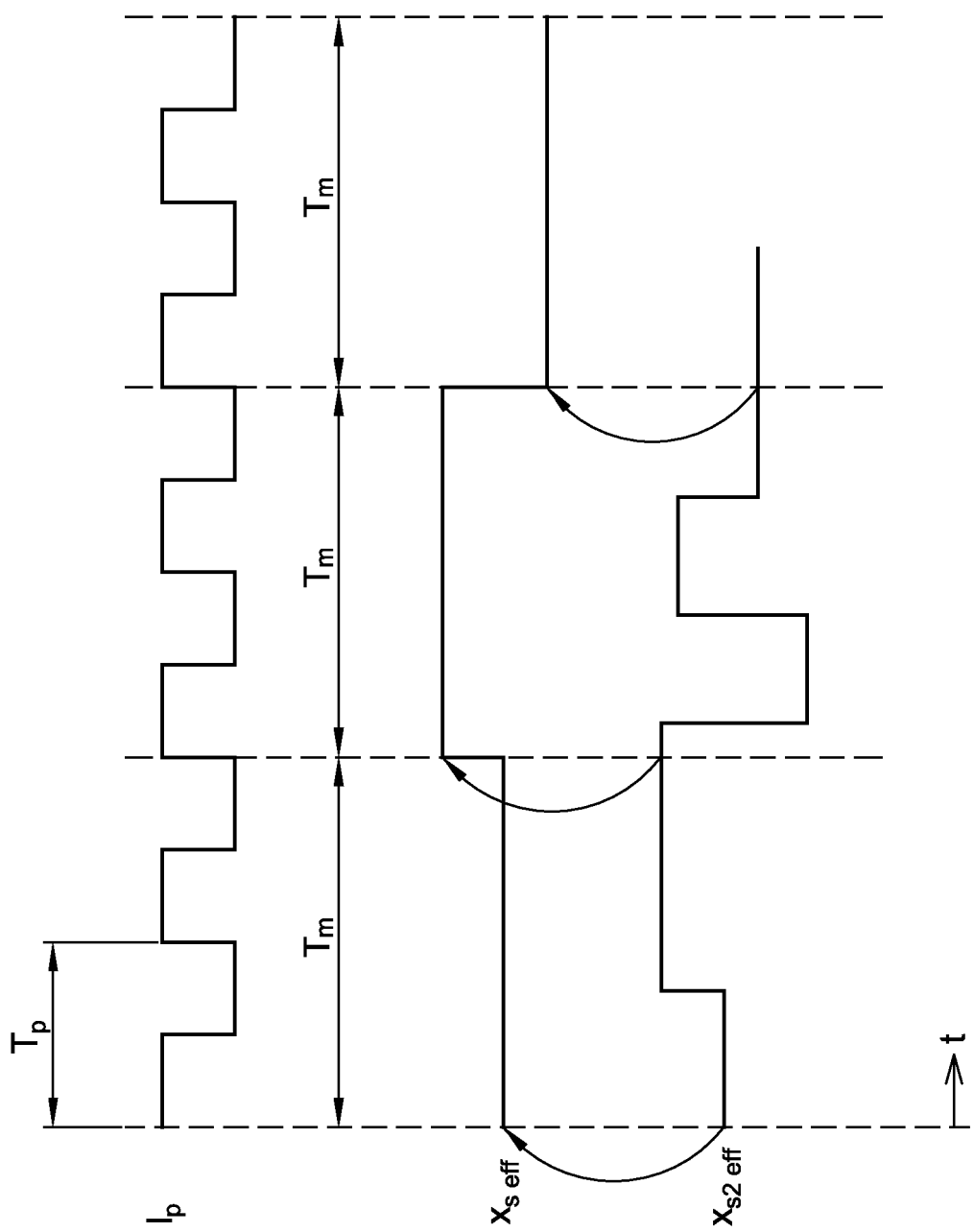
Figure 8:
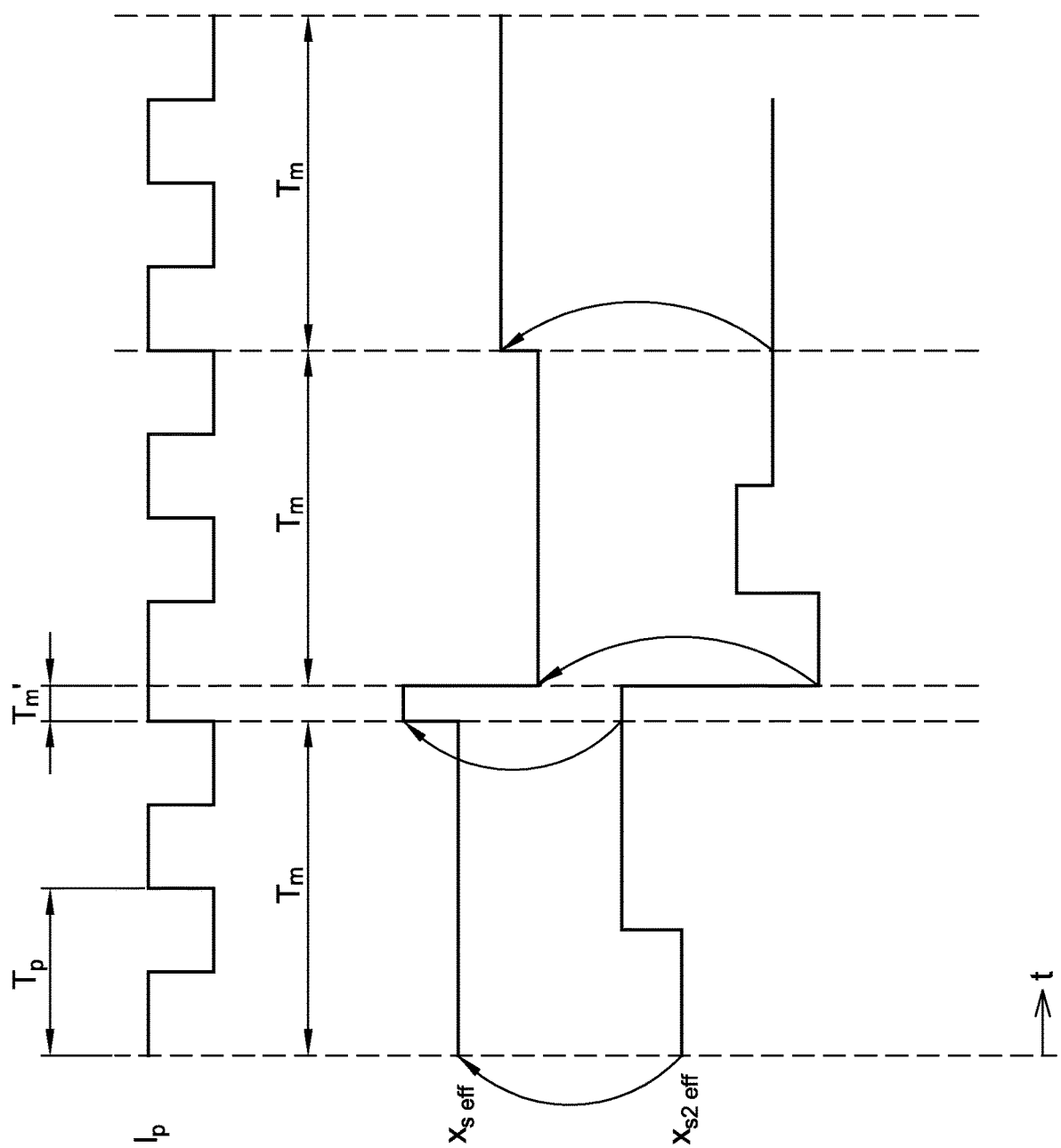
Figure 9:
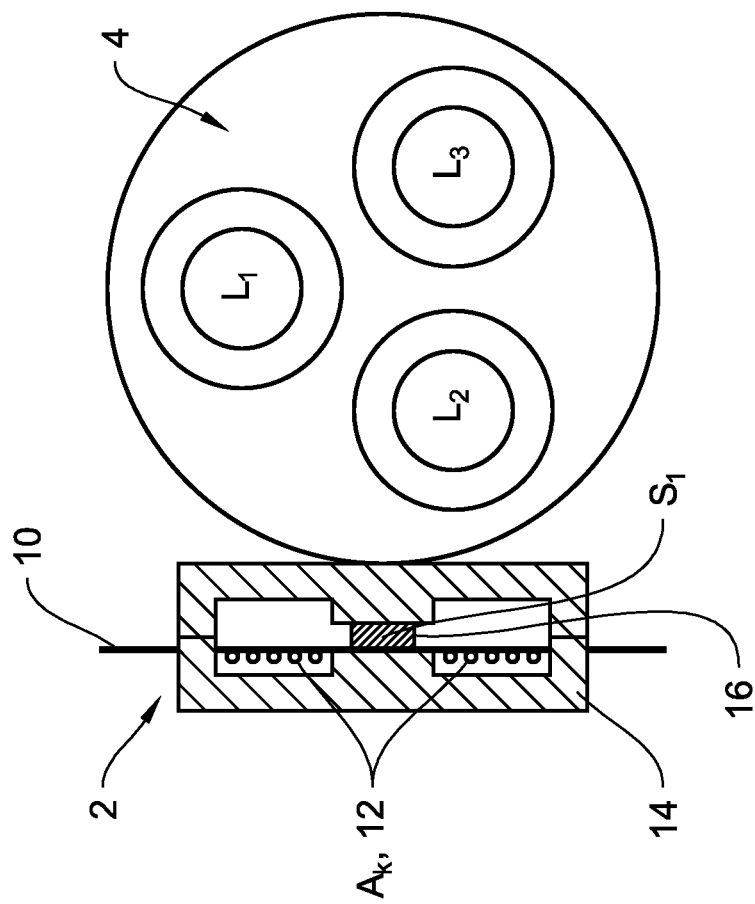

In the figures:

FIG. 1 shows a magnetic field measuring device according to the invention in schematic view, FIG. 2 shows a sensor arrangement of the magnetic field measuring device, FIG. 3 shows a load current- and a localization current in standardized view, FIG. 4 shows a superimposition of the load current and the localization current in standardized view, FIG. 5 shows a compensating current in standardized view, FIG. 6 shows sensor output signals of the first current sensor in standardized view, FIG. 7 shows a time chart regarding the synchronization behavior, FIG. 8 shows a time chart regarding the synchronization behavior when the first current sensor is overloaded and FIG. 9 shows a realization of the magnetic field measuring device in schematic view.

DETAILED DESCRIPTION

FIG. 1 shows a magnetic field measuring device 2 according to the invention and its position with respect to a line section 4 to be monitored in schematic view.

The line section 4 comprises two active conductors L1, L2, in which a load current IL for feeding connected loads and a (common-mode) localization current Ip for tracking a test current (localization current) circuit flow.

The load current IL generates an alternating magnetic field BL, the localization current IP flowing synchronously in both active conductors L1 and L2 generates a common-mode magnetic field Bp. Along the line section 4 to be monitored, a first current sensor S1 and a second current sensor S2 are disposed such that both current sensors S1, S2 are exposed to the same magnetic field strength which is comprised by the alternating magnetic field BL and the common-mode magnetic field Bp. However, the two current sensors S1, S2 are spaced apart from each other to the extent that a compensating magnetic field Bk only acts on the first current sensor S1, said compensating magnetic field Bk being caused by a compensating current Ik, which flows in a compensating coil Ak.

The second current sensor S2 therefore detects a resulting magnetic field B2, which is comprised by the alternating magnetic field BL and the common-mode magnetic field Bp, and supplies a second sensor output signal xs2 to a second signal processing block V2. The second signal processing block V2 generates an alternating voltage signal xs therefrom, which is fed to a compensating block Vk which generates the compensating current Ik therefrom which feeds the compensating coil Ak to establish the compensating magnetic field Bk.

In addition to the alternating magnetic field BL and the common-mode magnetic field Bp, the first current sensor S1 also detects the compensating magnetic field Bk generated by the compensating coil Ak as a partly compensated magnetic field B1.

A first sensor output signal xs1 of the first current sensor S1 corresponding to the partly compensated magnetic field B1 is fed to a first signal processing block V1 which, by means of digital processing methods, generates a localization signal xp therefrom which indicates an appearance of the localization current Ip in the line section 4 to be monitored and which is transmitted to a superordinate evaluation unit 15 of an insulation fault localization system IFLS.

Starting from the evaluation unit 15 of the insulation fault localization system IFLS, a synchronization signal xsync leads to the second signal processing block V2 in order to synchronize the time curve of the alternating voltage signal xs with a measuring period Tm (FIG. 7), which is predefined by the superordinate insulation fault localization system IFLS, during which a detection of the localization current Ip is realized.

The second signal processing block V2 comprises an overload detection 10 for generating an overload signal xov in case of an overload of the magnetic field measuring range of the first current sensor S1. The overload signal xov is transmitted to the insulation fault localization system IFLS which causes a restart of the measuring period Tm and which communicates this restart to the second signal processing block V2 via the synchronization signal xsync.

The compensating block Vk receives an adjustment signal xad from the second signal processing block V2 in order to adjust the compensation current Ik to the magnetic field measuring range of the first current sensor S1 in an adjustment circuit 12.

Optionally, the first signal processing block V1 generates a fine compensating signal xf as an additional alternating voltage signal from the output signal supplied by the first current sensor S1, said fine compensating signal xf being phase synchronous to the detected mains-frequency alternating magnetic field BL and the amplitude of said fine compensating signal xf corresponding to the not fully compensated effect of this alternating magnetic field BL on the first current sensor S1. The fine compensating signal xf is supplied to the compensating block Vk and can be used to reduce the measurement uncertainty of the magnetic field measuring device 2 by not exceeding the magnetic field measuring range of the current sensor S1.

FIG. 2 shows a current sensor arrangement of the current sensors S1, S2 having the line section 4 to be monitored in a cross-sectional view. The line section 4 to be monitored comprises three active conductors L1, L2, L3 which lead the load current IL (FIG. 1) which generates an alternating magnetic field BL in the detection range of the current sensors S1, S2.

The two current sensors S1, S2 are disposed along the longitudinal extension of the line section 4 behind each other and in the circumferential direction of the line section 4 at the level of the conductor L3. In this cross-sectional view, the second current sensor 2 is concealed by the first current sensor S1 and not shown. Simulations of the alternative magnetic field BL generated by the load current and the common-mode magnetic field Bp caused by the localization current have revealed that it is favorable to arrange the two current sensors S1, S1 circumferential at the level of an active conductor L1, L2, L3 in order to achieve the best possible detection of the alternating magnetic field BL.

Furthermore, it is appropriate to arrange the current sensors S1, S1 towards ground starting from the line section 4 in order to effectively detect the common-mode magnetic field Bp caused by the localization current Ip.

The following FIGS. 3 to 6 each show current and signal curves for different measuring points of the magnetic field measuring device 2. For illustrating the operating principle of the magnetic field measuring device 2 according to the invention, the proportion of the localization current Ip to the mains-frequency load current IL has been reduced to 1 to 10 instead of the expected actual proportion of 1 to 1000. Additionally, the size indications are made in standardized view.

FIG. 3 shows the mains-frequency sinusoidal load current IL in proportion to the localization current Ip which, in this case, has a rectangular curve. The frequency of the load current IL is 50 Hz (mains frequency), the fundamental frequency of the rectangular wave of the localization current Ip is 10 Hz, which corresponds to a period duration Tp (FIG. 7) of 0.1 s. In principle, other curve shapes such as sine or triangular waves having other frequencies, if necessary, can also be used in addition to the rectangular curve of the localization current Ip, as long as it leads to an evaluable localization signal xp after detection and signal processing.

FIG. 4 shows the superimposition of the load current IL illustrated in FIG. 3 and the localization current illustrated in FIG. 3 in standardized view. This current curve generates a magnetic field equally acting on the first current sensor S1 and the second current sensor S2, which is comprised of the alternating magnetic field BL and the common-mode magnetic field Bp.

FIG. 5 shows the curve of the compensating current Ik which feeds the compensating coil Ak for generating the compensating magnetic field Bk. The quantization of the compensation current Ik can be seen, which is rough due to the low magnetic field measuring sensitivity. The quantization was carried out with 5 bits, equivalent to 32 quantization stages, for a better illustration.

In practice, the magnetic field measuring sensitivity of the first current sensor S1 should be high enough for the magnetic field of the localization current Ip to be resolved so high that a reliable detection of the localization current Ip is possible. Regarding the magnetic field measuring ranges, the dynamic range should be as large as possible within the frame of economical considerations. A mapping of the dynamic range with 14 to 16 bits seems acceptable in terms of costs.

The magnetic field measuring range of the second current sensor S2 should be large enough that the maximum strength of the alternating magnetic field BL caused by the mains-frequency load current IL can be processed without measuring range exceedances. The dynamic range of the second current sensor S2 should be measured such that the magnetic field measuring sensitivity of the second current sensor S2 can be about 64 (equivalent to 6 bits) to 512 (equivalent to 9 bits) times less than the magnetic field measuring sensitivity of the first current sensor S1. In general, a dynamic range which can be mapped with 12 bits is sufficient for the second current sensor S1. The total dynamic range which is achieved by combining the measured values of the first and second current sensors S1, S1 reaches about 22 bits to 24 bits.

FIG. 6 shows a sensor output signal xs1 of the first current sensor S1 after compensation in comparison to a sensor output signal xs1 which is caused by an impressed undisturbed localization current Ip.

The average level of a positive/negative (test) pulse of the sensor output signal xs1 after compensation corresponds to an undisturbed sensor output signal xs1 in this case, so that the localization signal xp derived from the sensor output signal xs1 in the first signal processing block V1 allows a simple and reliable detection of the localization current Ip.

FIG. 7 schematically describes the synchronization behavior between the localization current Ip, an effective value xseff of the alternating voltage signal xs (FIG. 1) generated by the second signal processing block V2 and an effective value xs2*eff* of the second sensor output signal xs2 (FIG. 1).

In the illustrated case example, the measuring period Tm extends over two periods Tp of the localization current Ip.

The lower line illustrates the effective value xs2*eff* of the second sensor output signal xs2, which changes stepwise during the measuring period Tm due to a change in the alternating magnetic field BL (load current change). The change, however, is only as large as is necessary for a magnetic field measuring range exceedance of the first current sensor S1 not to take place. To not compromise the detection of the localization current Ip, in particular by interferences during detection of the partially compensated magnetic field B1 by means of the first current sensor S1, the alternating voltage signal xs is continued unchanged at the output of the second signal processing block V2 during the measuring period Tm, i.e. the effective value of the alternating voltage signal xs is kept constant. The change in the alternating magnetic field BL during the measuring period Tm, meaning the step of the effective value xs2*eff* of the second sensor output signal xs2, is not noticeable in the effective value xseff until the beginning of the next measuring period Tm and is used as an effective value xseff for this following measuring period Tm, since no changed valued is available at the beginning of this following measuring period Tm.

FIG. 8 schematically shows the synchronization behavior when the first current sensor S1 is overloaded If the magnetic field measuring range of the first current sensor S1 is exceeded due to an excessive change in the alternating magnetic field BL, the measuring period Tm is canceled and restarted with an adjusted effective value xseff.

FIG. 9 shows a realization of the magnetic field measuring device 2 according to the invention in schematic view.

The position of the magnetic field measuring device 2 with respect to the line section 4 to be tested is shown in cross-sectional view. The magnetic field measuring device 2 comprises a circuit board 10, on which the compensating coil Ak is applied as a planar coil having a winding which is realized as a conducting path 12. The compensating current Ik flows through the conducting path 12 and generates a compensating magnetic field Bk which is conducted in a planar core 14 made of ferrite.

The first current sensor S1 for detecting the compensating magnetic field Bk, the alternating magnetic field BL and the common-mode magnetic field Bp is disposed in an air gap 16 of the planar core 14. The second current sensor S2, is disposed (in a concealed manner) in an axial direction of the line section 4 and in an equally circumferential position, the second current sensor S2 preferably also being disposed on the circuit board 10, but separated from the first current sensor at such a distance that the compensation magnetic field Bk generated by the compensating coil Ak does not act on the detection range of the second current sensor S2.

The invention claimed is:

1. A magnetic field measuring device for detecting a localization current (Ip) in a branched AC power supply system, wherein a load current (IL) having a mains frequency flows through a line section to be tested of the AC power supply system and the localization current (Ip) has a fundamental frequency lower than the mains frequency, the magnetic field measuring device comprising:
   a current sensor arrangement mounted on the line section to be tested and comprising a first current sensor (S1), a second current sensor (S2) and a compensating coil (Ak), which generates a compensating magnetic field (Bk) acting in a detection range of the first current sensor (S1) and serving to partially compensate a mains-frequency alternating magnetic field (BL) which is caused by the load current (IL);
   a first signal processing block (V1);
   a second signal processing block (V2); and
   a compensating block (Vk);
   wherein the first current sensor (S1) and the second current sensor (S2) are disposed such that, in addition to the compensating magnetic field (Bk), the first current sensor (S1) detects the alternating magnetic field (BL) and a common-mode magnetic field (Bp) caused by the localization current (Ip) as a partially compensated magnetic field (B1), and the impact of the compensating magnetic field (Bk) generated by the compensating coil (Ak) on the second current sensor (S2) is negligible, the second current sensor (S2) thus detecting only the alternating magnetic field (BL) and the common-mode magnetic field (Bp) caused by the localization current (Ip) as a resulting magnetic field (B2);
   wherein the first signal processing block (V1) generates a localization signal (xp) indicating the localization current (Ip) from a first sensor output signal (xs1) generated by the first current sensor (S1), the second signal processing block (V2) generates an alternating voltage signal (xs) corresponding to the resulting magnetic field (B2) from a second sensor output signal (xs2) generated by the second current sensor (S2) and the compensating block (Vk) connected downstream of the second signal processing block (V2) generates a compensating current (Ik), which feeds the compensating coil (Ak), from the alternating voltage signal (xs);
   wherein the second signal processing block (V2) has a signal input for receiving a synchronization signal (xsync) in order to synchronize a specified measuring period (Tm), during which the localization current (Ip) is detected, with the alternating voltage signal (xs); and
   wherein the current sensors (S1, S2) are designed such that the second current sensor (S2) has a lower magnetic field measuring sensitivity than the first current sensor (S1) and a greater magnetic field measuring range, which is why the partial compensation occurs only to the extent that the partially compensated magnetic field (B1) does not exceed the magnetic field measuring range of the first current sensor (S1).

2. Magnetic field measuring device according to claim 1, characterized in that the second signal processing block (V2) is designed such that the generated alternating voltage signal (xs) is continued unchanged during the measuring period (Tm), wherein the measuring period (Tm) extends over several periods (Tp) of the localization current (Ip).

3. The magnetic field measuring device according to claim 1, characterized in that the second signal processing block (V2) has an overload detection for generating an overload signal (xov) in case of an overload of the magnetic field measuring range of the first current sensor (S1).

4. The magnetic field measuring device according to claim 1, characterized in that the compensating block (Vk) has an adjustment circuit for adjusting the compensating current (Ik) and a signal input for receiving an adjustment signal (xad) generated by the second signal processing block (V2).

5. The magnetic field measuring device according to claim 1, characterized in that
the first signal processing block (V1) is designed to generate a fine compensating signal (xf) which is supplied to the compensating block (Vk) for fine compensation of the alternating magnetic field (BL).

6. The magnetic field measuring device according to claim 1, characterized in that
the compensating coil (Ak) is a planar coil of which the winding is realized as a conducting path on a circuit board and which has a planar core made of ferrite.

7. The magnetic field measuring device according to claim 6, characterized in that
the planar core concentrically has an air gap in which the first current sensor (S1) is disposed.

8. The magnetic field measuring device according to claim 6, characterized by
an embodiment as an independent assembly comprising the circuit board and a surrounding housing or a casting compound, wherein electronic components for signal processing are additionally disposed on the circuit board.

9. The magnetic field measuring device according to claim 6, characterized in that
the second current sensor (S2) is disposed on the circuit board or realized as a separate structural unit.

10. A use of a magnetic field measuring device according to claim 3, as a device for detecting a localization current for an insulation fault localization system (IFLS) in an AC power supply system, wherein the localization signal (xp) is transmitted to an evaluation unit of the insulation fault localization system (IFLS), the synchronization signal (xsync) is communicated by the insulation fault localization system (IFLS) and the overload signal (xov) is supplied to the insulation fault localization system (IFLS).

11. A method for detecting a localization current (Ip) in a branched AC power supply system, wherein a load current (IL) having a mains frequency flows through a line section to be tested of the AC power supply system and the localization current (Ip) has a fundamental frequency lower than the mains frequency, the method comprising the following steps:
mounting a current sensor arrangement comprising a first current sensor (S1), a second current sensor (S2) and a compensating coil (Ak), which generates a compensating magnetic field (Bk) acting in a detection range of the first current sensor (S1) and serving to partially compensate a mains-frequency alternating magnetic field (BL) which is caused by the load current (IL), on the line section to be tested in such a manner that the first current sensor (S1) and the second current sensor (S2) are disposed such that, in addition to the compensating magnetic field (Bk), the first current sensor (S1) detects the alternating magnetic field (BL) and a common-mode magnetic field (Bp) caused by the localization current (Ip) as a partially compensated magnetic field (B1), and the impact of the compensating magnetic field (Bk) generated by the compensating coil (Ak) on the second current sensor (S2) is negligible, the second current sensor (S2) thus detecting only the alternating magnetic field (BL) and the common-mode magnetic field (Bp) caused by the localization current (Ip) as a resulting magnetic field (B2),
generating a localization signal (xp) indicating the localization current (Ip) from a first sensor output signal (xs1), which is generated by the first current sensor (S1), by means of a first signal processing block (V1),
generating an alternating voltage signal (xs) from a second sensor output signal (xs2), which is generated by the second current sensor (S2), by means of a second signal processing block (V2),
generating a compensating current (Ik), which feeds the compensating coil (Ak), from the alternating voltage signal (xs), which is generated by second signal processing block (V2), by means of a compensating block (Vk),
receiving a synchronization signal (xsync) in the second signal processing block (V2) in order to synchronize a specified measuring period (Tm), during which a detection of the localization current (Ip) is detected, with the alternating voltage signal (xs), and wherein
the current sensors (S1, S2) are selected such that, compared to the first current sensor (S1), the second current sensor (S2) has a lower magnetic field measuring sensitivity and a greater magnetic field measuring range, which is why the partial compensation occurs only to the extent that the partially compensated magnetic field (B1) does not exceed the magnetic field measuring range of the first current sensor (S1).

12. The method according to claim 11, characterized in that the generated alternating voltage signal (xs) is continued unchanged during the measuring period (Tm), wherein the measuring period (Tm) extends over several periods (Tp) of the localization current (Ip).

13. The method according to claim 11, characterized by generating an overload signal (xov) for detecting an overload of the magnetic field measuring range of the first current sensor (S1) in the second signal processing block (V2).

14. The method according to claim 13, characterized by adjusting the compensating current (Ik) in the compensating block (Vk) in case the compensating block (Vk) receives an adjustment signal (xad) from the second signal processing block (V2).

15. The method according to claim 11, characterized by generating a fine compensating signal (xf) in the first signal processing block (V1), which is supplied to the compensating block (Vk) for fine compensation of the alternating magnetic field (BL).

* * * * *